US009857930B2

(12) United States Patent
Sebastian et al.

(10) Patent No.: US 9,857,930 B2
(45) Date of Patent: Jan. 2, 2018

(54) TRANSPARENT CONDUCTIVE COMPONENT WITH INTERCONNECT CIRCUIT TAB COMPRISING CURED ORGANIC POLYMERIC MATERIAL

(71) Applicant: 3M INNOVATIVE PROPERTIES COMPANY, St. Paul, MN (US)

(72) Inventors: Muthu Sebastian, Singapore (SG); Roger W. Barton, Afton, MN (US); Dominic M. Travasso, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/970,695

(22) Filed: Dec. 16, 2015

(65) Prior Publication Data
US 2017/0177108 A1 Jun. 22, 2017

(51) Int. Cl.
*G06F 3/045* (2006.01)
*G06F 3/044* (2006.01)
(Continued)

(52) U.S. Cl.
CPC .............. *G06F 3/044* (2013.01); *B32B 27/06* (2013.01); *H05K 1/189* (2013.01);
(Continued)

(58) Field of Classification Search
CPC .... G06F 3/03547; G06F 3/0416; G06F 3/044; G06F 3/045; G06F 3/047;
(Continued)

(56) References Cited

U.S. PATENT DOCUMENTS 5,159,159 A    10/1992   Asher
5,838,412 A * 11/1998   Ueda .................... G02B 6/0088
                                                                349/150
(Continued)

FOREIGN PATENT DOCUMENTS

WO    WO 2013-010067     1/2013
WO    WO 2013-049267     4/2013
(Continued)

OTHER PUBLICATIONS

Peter Macleod "Prime Faraday Technology Watch ISBN1-84402-023-1 Flexible Circuit Technology A Review of Flexible Circuit Technology and its Applications," Jun. 1, 2002 (Jun. 1, 2002), XP055288935.
(Continued)

*Primary Examiner* — Joe H Cheng
(74) *Attorney, Agent, or Firm* — Clifton F. Richardson; Carolyn A. Fischer

(57) ABSTRACT

In one embodiment a transparent conductive component is described comprising a flexible transparent substrate; a transparent conductive layer disposed on the flexible transparent substrate; and a plurality of metal traces disposed on and in electrical communication with the transparent conductive layer. A portion of the flexible transparent substrate comprising the transparent conductive layer and metal traces forms an interconnect circuit tab. At least the interconnect circuit tab comprises a cured organic polymeric material disposed on the (e.g. patterned) transparent conductive layer and metal traces metal traces and flexible transparent substrate such that the cured organic polymeric material forms an exposed surface layer. The cured organic polymeric material is optionally disposed at the bezel region and/or at a central region of the transparent conductive component (e.g. touch sensor).

23 Claims, 5 Drawing Sheets

(51) Int. Cl.
*B32B 27/06* (2006.01)
*H05K 1/18* (2006.01)

(52) U.S. Cl.
CPC ... *B32B 2307/202* (2013.01); *B32B 2307/412* (2013.01); *B32B 2457/208* (2013.01); *G06F 2203/04103* (2013.01)

(58) Field of Classification Search
CPC . G06F 2203/04103; G06F 2203/04112; B32B 2307/412; B32B 2457/208; H01L 31/1884; H01R 12/79; H05K 3/0058; H05K 2201/10128
See application file for complete search history.

(56) References Cited

U.S. PATENT DOCUMENTS

| | | | |
|---|---|---|---|
| 6,680,731 B2 | 1/2004 | Gerpheide | |
| 7,151,528 B2 | 12/2006 | Taylor | |
| 7,948,477 B2 | 5/2011 | Hotelling | |
| 8,018,563 B2 | 9/2011 | Jones | |
| 8,050,040 B2 | 11/2011 | Huang | |
| 8,094,247 B2 | 1/2012 | Allemand | |
| 8,179,381 B2 | 5/2012 | Frey | |
| 8,390,589 B2 | 3/2013 | Hu | |
| 8,647,519 B1 | 2/2014 | Lin | |
| 8,711,113 B2 | 4/2014 | Taylor | |
| 2002/0015127 A1* | 2/2002 | Hagiwara | G02F 1/1345 349/149 |
| 2004/0006680 A1 | 1/2004 | Duncan | |
| 2005/0267264 A1* | 12/2005 | Takei | C08G 61/126 525/242 |
| 2006/0178448 A1 | 8/2006 | Wang | |
| 2007/0071085 A1* | 3/2007 | Usui | H03K 5/1252 375/229 |
| 2008/0143949 A1* | 6/2008 | Ino | G02F 1/133308 349/151 |
| 2008/0158181 A1 | 7/2008 | Hamblin | |
| 2009/0040590 A1* | 2/2009 | Sasagawa | B81B 7/0006 359/290 |
| 2009/0266624 A1* | 10/2009 | Kondoh | G06F 3/045 178/18.05 |
| 2010/0085315 A1* | 4/2010 | Hsih | G06F 3/0416 345/173 |
| 2011/0139516 A1 | 6/2011 | Nirmal | |
| 2013/0241850 A1* | 9/2013 | Ito | G06F 3/041 345/173 |
| 2013/0279769 A1* | 10/2013 | Benkley, III | G06K 9/00013 382/124 |
| 2014/0124477 A1* | 5/2014 | Sebastian | C09K 13/04 216/41 |
| 2014/0198266 A1 | 7/2014 | Park | |
| 2014/0299365 A1* | 10/2014 | Sebastian | G06F 3/044 174/255 |
| 2015/0199048 A1 | 7/2015 | Monson | |
| 2015/0355738 A1 | 12/2015 | Lee | |
| 2015/0370379 A1* | 12/2015 | Hayashi | G06F 3/044 345/174 |

FOREIGN PATENT DOCUMENTS

| | | |
|---|---|---|
| WO | WO 2014-093014 | 6/2014 |
| WO | WO 2014-143186 | 9/2014 |
| WO | WO 2014/148486 | 9/2014 |
| WO | WO 2014-168712 | 10/2014 |
| WO | WO 2015-088750 | 6/2015 |

OTHER PUBLICATIONS

International Search Report, International Application No. PCT/US2016/022414, Jul. 26, 2016.
"DuPont TeijinFilms", Melinex505, 1 page; Nov. 17, 2010.

* cited by examiner

TRANSPARENT CONDUCTIVE COMPONENT WITH INTERCONNECT CIRCUIT TAB COMPRISING CURED ORGANIC POLYMERIC MATERIAL

SUMMARY

In one embodiment, a transparent conductive component is described comprising a flexible transparent substrate. A transparent conductive layer is disposed on the flexible transparent substrate at least at a central region (e.g. viewing area) of the flexible transparent substrate. A plurality of metal traces are disposed on and in electrical communication with the transparent conductive layer. A portion of the flexible transparent substrate comprising the (e.g. patterned) metal traces and optionally the transparent conductive layer forms an interconnect circuit tab. At least the interconnect circuit tab comprises a cured organic polymeric material disposed on the metal traces, optional transparent conductive layer, and flexible transparent substrate such that the cured organic polymeric material forms an exposed surface layer. The bezel region and/or central region (e.g. viewing area) may also comprise a cured organic polymeric material.

In some embodiments, the cured organic polymeric material can provide a more flexible interconnect circuit tab. In some embodiments, the metal traces do not crack when the interconnect circuit tab is bent to a radius of 2 mm at least 40 cycles.

Also described is a touch sensor comprising the transparent conductive component described herein and a method of making a transparent conductive component and touch sensor.

BRIEF DESCRIPTION OF THE DRAWINGS

Figure 1:
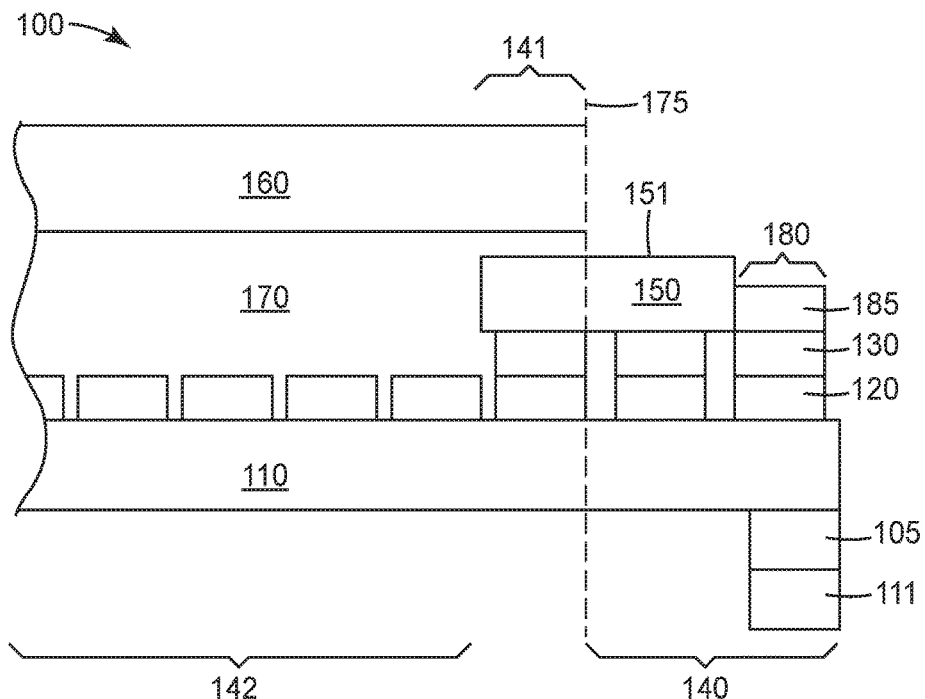
FIG. 1 is a cross-sectional schematic view of an embodied transparent conductive component.

FIG. 1 depicts a cross-sectional view of an embodied transparent conductive component 100. The transparent conductive component 100 comprises a flexible transparent substrate 110 and a (e.g. patterned) transparent conductive layer 120 (such as indium tin oxide "ITO") disposed on the flexible transparent substrate 110 at least at a central region 142 (e.g. viewing area) of the flexible transparent substrate 110. A plurality of metal traces 130 are disposed on and in electrical communication with the transparent conductive layer 120. A portion of the flexible transparent substrate comprising the (e.g. patterned) metal traces 130 and optionally the transparent conductive layer 120 forms an interconnect circuit tab 140 including electrically conductive pad 180. Bezel region 141 is disposed between the central region 142 (e.g. viewing area) and interconnect circuit tab 140. In other words, the central region is defined by the bezel region. The interconnect circuit tab 140 (except for the electrically conductive pad 180) comprises a cured organic polymeric layer 150 disposed on the (e.g. patterned) metal traces 130, optional transparent conductive layer 120, and flexible transparent substrate 110. The cured organic polymeric material typically forms an exposed surface layer 151.

The central region (142) (e.g. viewing area) of the transparent conductive component (100) comprises the flexible transparent substrate 110 and (e.g. patterned) transparent conductive layer 120 (such as indium tin oxide "ITO") as previously described. The central region (142) (e.g. viewing area) of the transparent conductive component 100 further comprises an optically transparent cover layer 160. In one favored embodiment, the cover layer 160 is a rigid cover glass, such as Gorilla glass from Corning, bonded to the transparent conductive layer 120 with an optically transparent adhesive material 170. In another embodiment, the cover layer 160 is a rigid or flexible polymeric sheet such as (e.g. PET) polymeric coverlay bonded to the transparent conductive layer 120 with an optically transparent adhesive material 170. In yet another embodiment, the cover layer is a cured organic polymeric material 250, such as the same cured organic polymeric material as the exposed surface layer of interconnect circuit tab 240, as depicted in FIG. 2.

In one embodiment, the central region 142 (e.g. viewing area) of the transparent conductive component 100 comprises a rigid cover layer 160, such as glass, transparent conductive layer 120, and flexible transparent substrate 110 with an optically transparent adhesive material 170 adjacent the interconnect circuit tab 140. However, the interconnect circuit tab 140, and particularly at plane 175 that is subject to bending when the interconnect circuit tab 140 is inserted into a receiving member of an electronic device (not shown), is free of a rigid cover layer 160, such as glass and optically transparent adhesive material 170. The interconnect circuit tab is also free of (e.g. PET) polymeric coverlay and optically transparent adhesive material.

In the embodiment of FIG. 1, the bezel region 141 comprises a rigid cover layer 160, such as glass 160, and metal traces 130, transparent conductive layer 120, flexible transparent substrate 110, and optically transparent adhesive material 170. The rigid cover layer (e.g. glass or (e.g. PET) polymeric coverlay may further comprise regions printed with ink, especially at the bezel region, to mask the metal traces. The bezel region 141 also comprises a cured organic polymeric layer 150 disposed between the metal traces 130 and transparent adhesive material 170. The bezel region 141 also comprise the same cover layer 160 as the central region 142, as previously described. In another embodiment, the bezel region 141 may be free of such rigid cover layers. The exposed surface layer of the bezel region 141 may comprise a cured organic polymeric material, such as the same cured organic polymeric material as the exposed surface layer of interconnect circuit tab 140 or a corrosion resistant surface layer as will subsequently be described.

Figure 2:
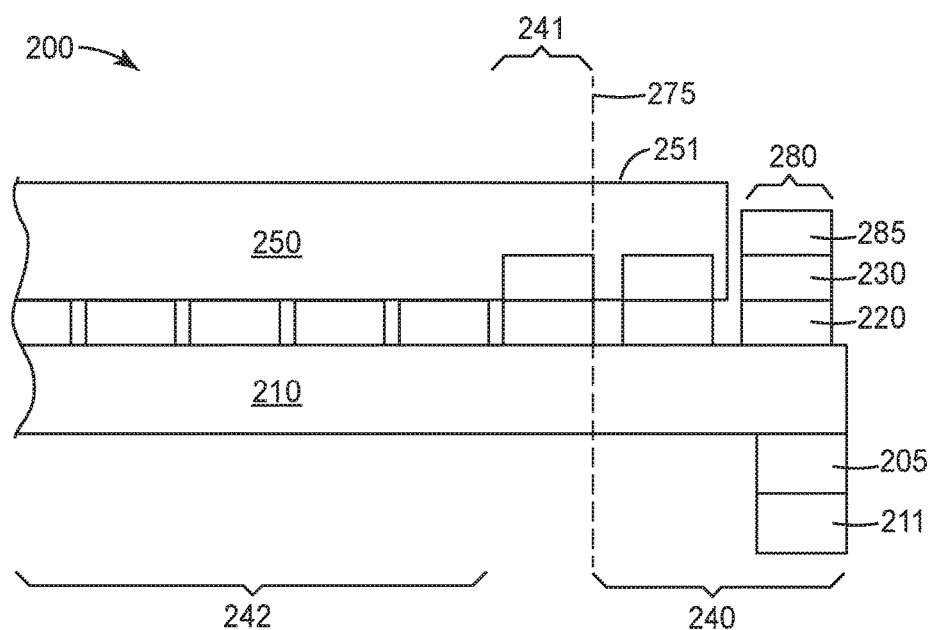
FIG. 2 is a cross-sectional schematic view of another embodied transparent conductive component.

FIG. 2 depicts a cross-sectional view of another embodied transparent conductive component 200. The transparent conductive component 200 comprises a flexible transparent substrate 210 and a (e.g. patterned) transparent conductive layer 220 (such as indium tin oxide, "ITO") disposed on the flexible transparent substrate at least at a central region 242 (e.g. viewing area) of the flexible transparent substrate. A plurality of metal traces 230 are disposed on and in electrical communication with the transparent conductive layer 220. A portion of the flexible transparent substrate comprising the (e.g. patterned) metal traces 230 and optionally the transparent conductive layer 220 forms an interconnect circuit tab 240 including electrically conductive pad 280. Bezel region 241 is disposed between central region 242 (e.g. viewing area) and interconnect circuit tab 240. The interconnect circuit tab 240 (except for the electrically conductive pad 280) comprises a cured organic polymeric layer 250 disposed on the (e.g. patterned) metal traces 230, optional transparent conductive layer 220, and flexible transparent substrate 210 such that the cured organic polymeric layer 250 forms an exposed surface layer 251. In this embodiment, the central region 242 (e.g. viewing area) of the transparent conductive component 200 also comprises a cured organic polymeric layer 250. Thus, the interconnect circuit tab 240, bezel region 241, and central region 242 are free of a rigid cover layer such as glass bonded with an optically transparent adhesive material. The interconnect circuit tab 240, bezel region 241, and central region 242 are also free of PET coverlay bonded with an optically transparent adhesive material.

In typical embodiments, the cured organic polymeric layer 250 of the central region 242 (e.g. viewing area) comprises the same material as the cured organic polymeric layer of the interconnect circuit tab 240. However, in another embodiment, the cured organic polymeric layer 250 of the central region 242 (e.g. viewing area) is different than the cured organic polymeric layer 250 of the interconnect circuit tab 240. For example, the cured organic polymeric layer 250 of the central region 242 (e.g. viewing area) may comprise a cured transparent polymerizable resin composition; whereas the cured organic polymeric layer 250 of the interconnect circuit tab 240 may comprise a dry film solder mask. The cured organic polymeric layer 250 of the central region 242 (e.g. viewing area) is optically transparent; whereas the cured organic polymeric layer 250 of the bezel region interconnect circuit tab can be less transparent or opaque.

The bezel region (141, 241) and interconnect circuit tab (140, 240) can comprise various electrically conductive materials. In typical embodiments, the metal traces are prepared from a crack resistant metal such as copper, silver, nickel and aluminum. In one embodiment, the metal traces (130, 230) comprise a crack resistant metal (e.g. copper) and transparent conductive material (e.g. ITO). In some embodiments, such as when copper metal traces are utilized, a corrosion resistant surface layer (185, 285) comprising a metal material such as tin, gold, nickel, or silver is plated onto the metal traces such as depicted in FIGS. 1 and 2. In another embodiment (not shown), the electrically conductive pad (180, 280) may comprise a metallic AgPdNd alloy coating ("APD") disposed on the (e.g. patterned) transparent conductive layer (120, 220). APD metal coatings are typically applied utilizing a vacuum deposition process as described in WO2014/168712; incorporated herein by reference. In this embodiment, an additional surface layer (185, 285) is typically not present. In yet another embodiment (not shown), the metal traces (130, 230) of the electrically conductive pad (180, 280) may comprise silver disposed directly on the flexible transparent substrate (110, 210) in the absence of (e.g. patterned) transparent conductive layer (120, 220) and in the absence of surface layer (185, 285).

The metal traces form an electrically conductive pad, also referred to herein as a "bonding pad" near a peripheral edge of the interconnect circuit tab. The electrically conductive pad (180, 280) of FIGS. 1 and 2 may optionally comprise one or more additional layers disposed on flexible transparent substrate (110, 210) for the purpose of stiffening or in other words decreasing the flexibility of the electrically conductive pad (180, 280) at the area proximate the bonding pad, but not including plane (175, 275) that is subject to bending. In one embodiment, a stiffening layer such as a rigid sheet material (111, 211) (such as an epoxy/glass construction or a thick polyimide film) is bonded by means of an adhesive (105, 205). Although an optically transparent adhesive material can be used to bond the rigid sheet material, other adhesive compositions that are not optically transparent can also be utilized in the bezel and interconnect circuit tab regions.

Figure 3A:
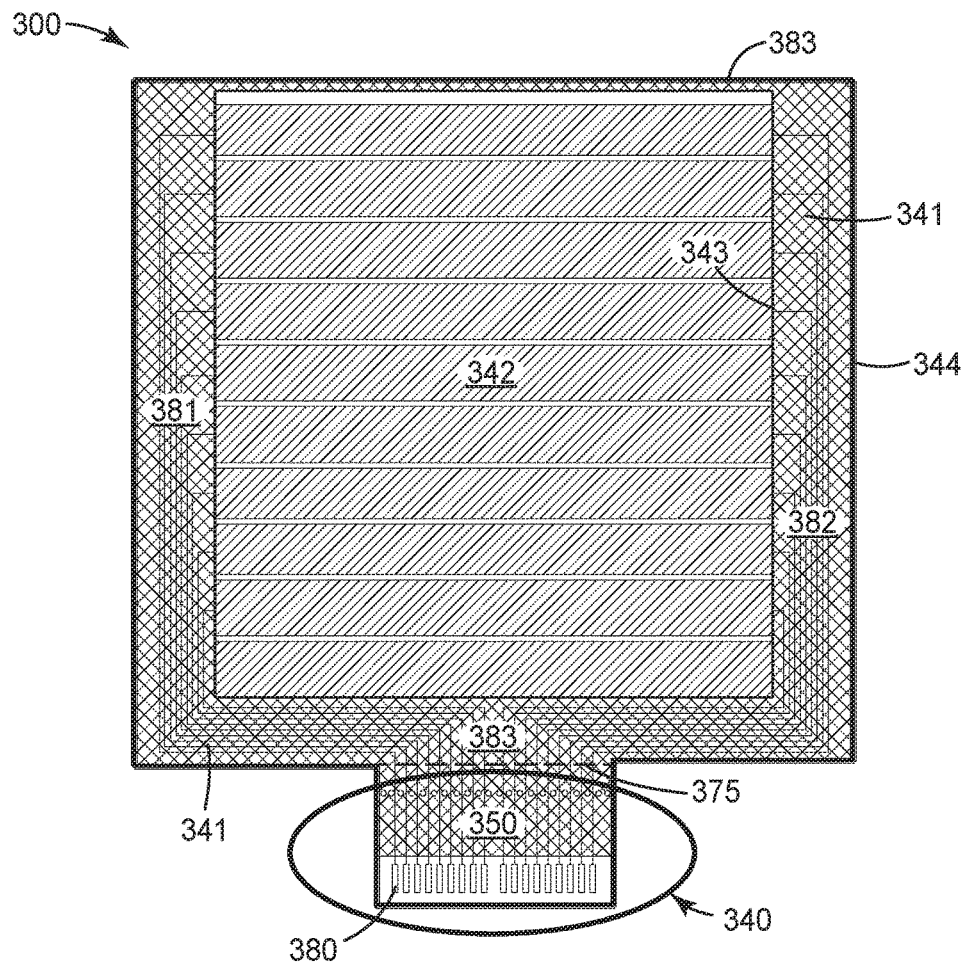
FIG. 3A is a top planar view of an embodied transparent conductive component.

With reference to FIG. 3A, a top planar view, transparent conductive component 300 comprises a central region 342 (i.e. viewing area), a bezel region 341 (i.e. bezel area) surrounding the central region 342 (e.g. viewing area), and interconnect circuit tab 340 (i.e. interconnect tab area) extending from the bezel region 341. In some embodiments, the interconnect circuit tab 340 extends at least 0.5, 0.75, or 1 cm ranging up to 3, 4, or 5 cm from bezel region. The width of the interconnect circuit tab 340 is typically at least 1 or 2 cm and may range up to 5, 6, 7, 8, 9, or 10 cm. The bezel region is generally the area of the transparent conductive component spanning from the edge 343 of the edge of the central region 342 (e.g. viewing area) to the outer edge 344 of the bezel region 341. When the transparent conductive component 300 is a touch sensor, the central region 342 is characterized as the viewing area whereas the bezel region 341 forms a frame surrounding the central region 342 (e.g. viewing area). The exposed surface layer of the central region 342 (e.g. viewing area) comprises an optically transparent cover layer such as a glass, (e.g. PET) polymeric coverlay or a cured optical transparent polymerizable resin as previously described. At least the interconnect circuit tab 340 and typically bezel region 383 adjacent the interconnect circuit tab 340 that includes plane 375 comprises the cured organic polymeric layer 350. In some embodiments, other portions of the bezel region 341 also comprise the cured organic polymeric layer 350. For example, side portions 381, 382 of the bezel, orthogonal to the side including the interconnect circuit tab 340 may comprise the cured organic polymeric layer 350. As another example, the side portion 383 of the bezel region, adjacent the side including the interconnect circuit tab 340 may comprise the cured organic polymeric layer 350. Interconnect circuit tab 340, comprises the cured organic layer 350, and is free of cover glass, (e.g. PET) coverlay, and optically transparent adhesive material.

The interconnect circuit tab 340 may further comprise a plurality of perforations or voids 390 proximate plane 375 that is subject to bending during use to increase the flexibility of the interconnect circuit tab 340 when the interconnect bonding pad 380 is inserted into a receiving member of an electronic device (not shown) such as a phone or a computer. The size and shape of the perforations can vary. In some embodiments, the perforations are substantially circular having a diameter of at least 5, 10, 15, 20, or 25 microns ranging up to 50, 75, or 100 microns.

Figure 4:
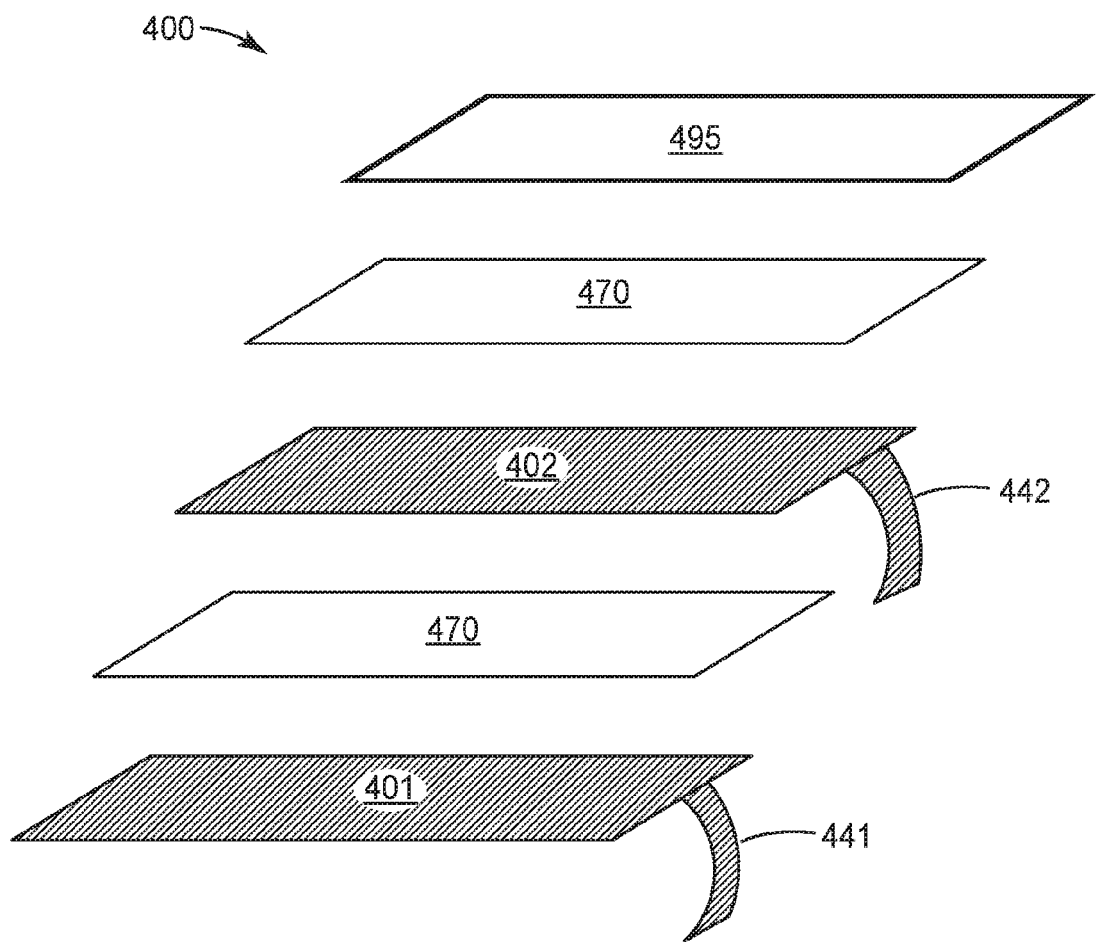
FIG. 4 is an exploded perspective view of an embodied touch sensor.

The transparent conductive component 200 described herein can be utilized in a touch sensor. With reference to FIG. 4, an exploded perspective view of an embodied touch sensor assembly 400. The touch sensor 400 comprises a first transparent conductive component 401 comprising a first interconnect circuit tab 441 bonded to a second transparent conductive component 402 comprising a second interconnect circuit tab 442 with an optically transparent adhesive material 470. In typical embodiments, the second transparent conductive component 402 is also bonded to a rigid transparent substrate 495, such as glass, with an optically transparent adhesive material 470.

Figure 5:
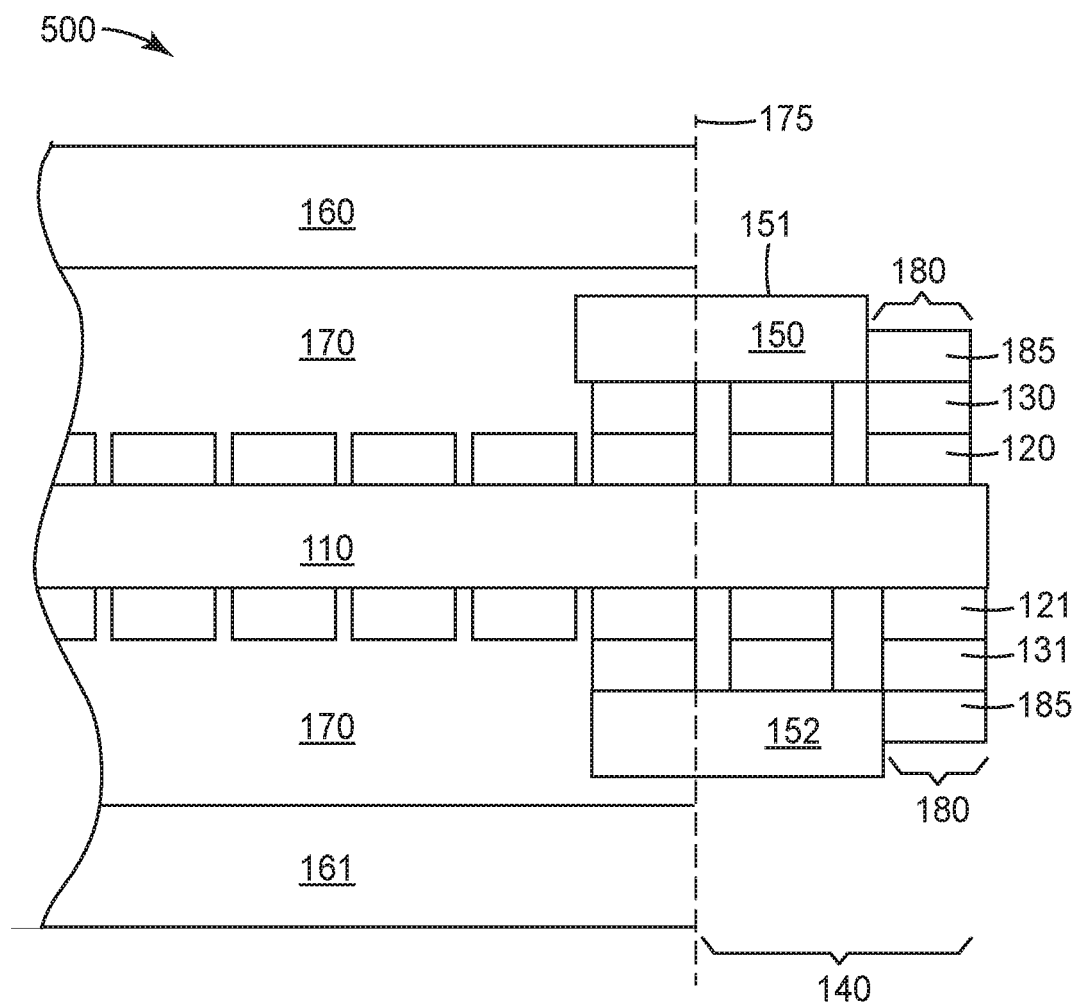
FIG. 5 is a cross-sectional schematic view of another embodied transparent conductive component.
Figure 6:
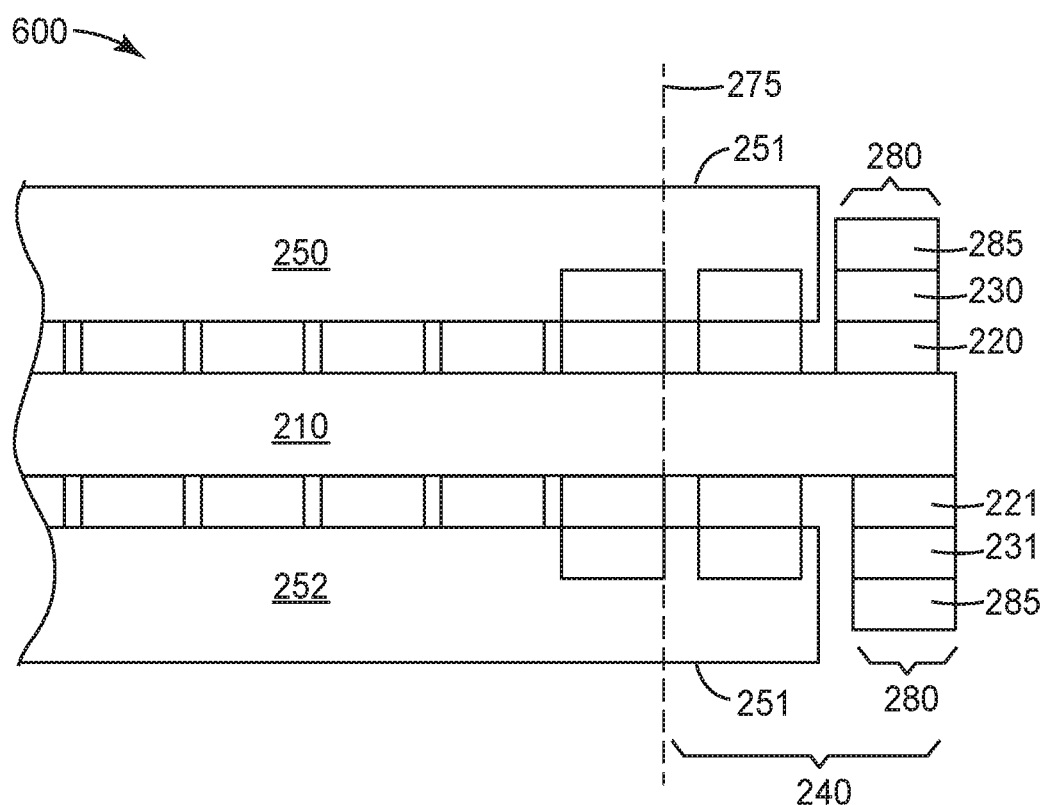
FIG. 6 is a cross-sectional schematic view of another embodied transparent conductive component.

In another embodiment, transparent conductive component 402 further comprises transparent conductive layer, metal traces, etc. on the opposite major surface of the same transparent substrate (e.g. 110 with reference to FIG. 1) and comprises the interconnect circuit tab, as previously described. The central region is bonded to a rigid transparent substrate 495, such as glass, with and optically transparent adhesive material 470. Thus, transparent conductive component 402 includes two layers of transparent conductive layers, metal traces, etc. and a second (separate) transparent conductive component 401 is absent from this construction. These constructions are illustrated in FIGS. 5 and 6.

Embodied transparent conductive components 500, 600 comprise a transparent substrate (110, 210) and a transparent conductive layer (120, 220) disposed on a major surface (e.g. the top side) of substrate (110, 210) while an additional (i.e. second) transparent conductive layer (121, 221) is disposed on the opposing, (e.g. bottom side) of substrate (110, 210). Additionally, a plurality of metal traces (130, 230) are disposed on the transparent conductor (120, 220) while another plurality of second metal traces (131, 231) are disposed on the transparent conductor (121, 221).

A portion of the flexible transparent substrate comprising the (e.g. patterned) metal traces 130 and 131 (as well as 230 and 231 of FIG. 6), and optionally the transparent conductive layers (120, 121 of FIG. 5 and 220, 221 of FIG. 6) forms an interconnect circuit tab (140, 240) including electrically conductive pad (180, 280). The interconnect circuit tab (140, 240) except for the electrically conductive pads (180, 280) comprising a cured organic polymeric layer (150, 250) disposed on the (e.g. patterned) metal traces (130, 131 of FIG. 5 and 230, 231 of FIG. 6) and an additional (i.e. second) cured organic polymeric layer (152, 252) disposed on the (e.g. patterned) metal traces (131, 231).

The materials employed for the transparent conductive layer (121, 221) and the metal traces (131, 132), and the cured organic polymeric layer (152, 252) all of which are disposed on the bottom of substrate (110, 210), can be the same as those already described with respect to the 120, 130, and 150. Further, optically transparent adhesive material 170 and cover layer 160 are also the same as previously described. The opposing (e.g. bottom) surface is typically bonded to a (e.g. liquid crystal or light emitting diode) display module 161.

It will be understood by those skilled in the art, that when the transparent conductive component is used as a touch sensor, it is useful to arrange patterns of the transparent conductors 120 and 121 (as well as 220 and 221 of FIG. 6) along directions in the plane of the substrate which are perpendicular to each other. The metal traces 130 and 131 (as well as 230 and 231) are then employed to route electrical signals from the interconnect circuit tab along the bezel region to each of the patterned transparent conductor traces 120 and 121 (as well as 220 and 221). Despite the perpendicular orientations of traces 120 and 121 (as well as 220 and 221), it is advantageous if the metal traces 130 and 131 (as well 230 and 231) route the electrical signals along the bezel region to a single interconnect circuit tab 140 (240), which in some embodiments may be placed at a single corner of the touch sensor, or in other embodiments near the center of one edge, as is shown for component 300, in FIG. 3A.

The interconnect circuit tab shown in FIGS. 5 and 6 includes an electrically conductive pad (180, 280) on both sides of the substrate (110, 210). In order to connect to a control board, it is possible to provide a zero insertion force connector which provides for simultaneous top and bottom contacts to each of the pads (180, 280) an example of which is the Hirose FH39 flexible circuit connector.

Figure 3B:
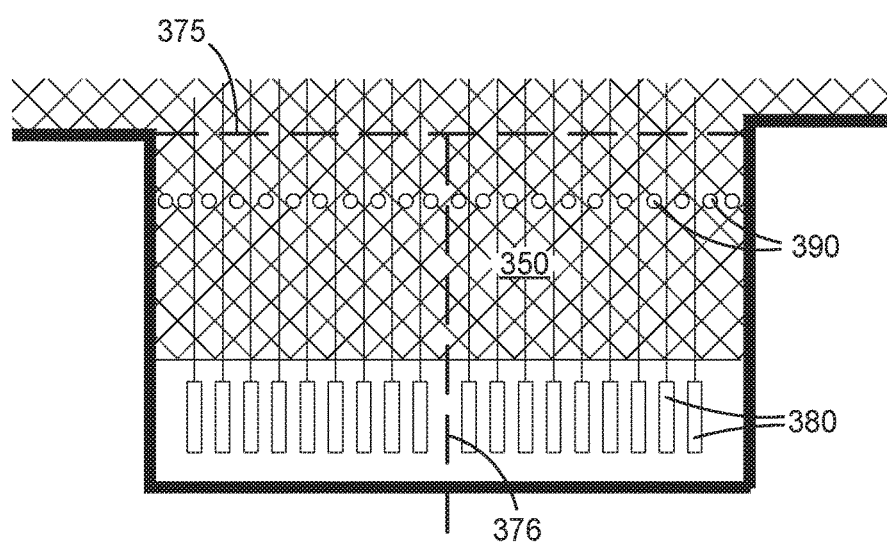
FIG. 3B is an enlarged view of the interconnect circuit tab of the transparent conductive component of FIG. 3A.

In an alternative embodiment, the interconnect circuit tab can be soldered directly to a controller board. In this embodiment a first soldering operation can be employed to make connections to the metal traces (130, 230) disposed on the top of the tab, to the controller board while a second soldering operation can be employed for the metal traces (131, 231) which are disposed on the bottom of the tab. To ensure that enough flexibility exists in the interconnect circuit tab for each of the two distinct soldering operations, it is advantageous to group the metal traces 130 and 131 (as well as 230 and 231 of FIG. 6) into adjacent regions of the interconnect circuit tab and separate these regions with a cut line with a length of 2-4 millimeters. With reference to FIG. 3B the cut line 376 may be at the center of the interconnect tab orthogonal to plane 375 separating the interconnect tab into two pieces. Metal traces (130, 230) disposed on one major surface (e.g. the top) of the tab of one piece (e.g. the left side) would be evident in plan view as shown in FIG. 3B. However, the metal traces (131, 231) which are disposed on the opposing major surface (e.g. the bottom) of the second piece (e.g. the right side) would not be evident in this plan view since no such metal traces are disposed on the opposing surface of the substrate. The cut line allows for one piece of the interconnect tab having, for instance, all of either traces 130 or the traces 131 (230 and 231 of FIG. 6) to be moved along a vertical axis relative to the second piece. For instance, the portion of the interconnect circuit with traces (130, 230) can be positioned in proximity to connectors along the bottom of the controller board prior to soldering, while a portion of the interconnect tab with traces (131, 231) can be positioned in proximity to connectors along the top of the controller board.

The transparent conductive component described herein comprises a (e.g. flexible) transparent substrate. Suitable substrates include polymeric films made of materials such as polyethylene terephthalate (PET); polyethylene naphthalate (PEN); polycarbonate (PC); polyetheretherketone (PEEK); polyethersulphone (PES); polyarylate (PAR); polyimide (PI); poly(methyl methacrylate) (PMMA); polycyclic olefin (PCO); cellulose triacetate (TAC); and polyurethane (PU).

Other suitable materials for the substrate include chlorotrifluoroethylene-vinylidene fluoride copolymer (CTFE/VDF), ethylene-chlorotrifluoroethylene copolymer (ECTFE), ethylene-tetrafluoroethylene copolymer (ETFE), fluorinated ethylene-propylene copolymer (FEP), polychlorotrifluoroethylene (PCTFE), perfluoroalkyl-tetrafluoroethylene copolymer (PFA), polytetrafluoroethylene (PTFE), polyvinylidene fluoride (PVDF), polyvinyl fluoride (PVF), tetrafluoroethylene-hexafluoropropylene copolymer (TFE/HFP), tetrafluoroethylene-hexafluoropropylene-vinylidene fluoride terpolymer (THV), polychlorotrifluoroethylene (PCTFE), hexafluoropropylene-vinylidene fluoride copolymer (HFP/VDF), tetrafluoroethylene-propylene copolymer (TFE/P), and tetrafluoroethylene-perfluoromethylether copolymer (TFE/PFMe).

In some embodiments, the thickness of the (e.g. flexible) transparent substrate is typically at least 50 microns ranging up to 200 microns. In some embodiments, the thickness of the substrate is no greater than 150 or 125 or 100 microns.

In some embodiments, these same transparent substrates can be used as the cover layer of the central (e.g. viewing area) region and optionally the bezel region.

A transparent conductive layer is disposed on the flexible transparent substrate of the transparent conductive component. The transparent conductive layer typically comprises transparent conducting oxides (TCOs) for the optically transparent electrodes. Suitable materials include for example ITO (Indium tin oxide); tin oxides; cadmium oxides ($CdSn_2O_4$, $CdGa_2O_4$, $CdIn_2O_4$, $CdSb_2O_6$, $CdGeO_4$); indium oxides ($In_2O_3$, Ga, $GaInO_3$ (Sn, Ge), $(GaIn)_2O_3$); zinc oxides (ZnO(Al), ZnO(Ga), $ZnSnO_3$, $Zn_2SnO_4$, $Zn_2In_2O_5$, $Zn_3In_2O_6$); and magnesium oxides ($MgIn_2O_4$, $MgIn_2O_4$—$Zn_2In_2O_5$).

In one embodiment, the a transparent conducting oxide (e.g. ITO) is applied by vacuum deposition (also known as sputtering) to form a multi-layer transparent electrode structure of ITO/SiAlOx/ITO layers. The process for deposition of this multi-layer electrode structure is described in greater detail US2011/0139516; incorporated herein by reference.

The optically transparent electrodes optionally comprise a solution coated or electro-deposited conductive polymer. The electrode can also be a vapor deposited transparent conductor. Conducting polymers include the following exemplary materials: polyaniline; polypyrrole; polythiophene; and PEDOT/PSS (poly(3,4 ethylenedioxythiophene)/polystyrenesulfonic acid). In yet another embodiment, the intervening layer comprises conductive particles dispersed in a binder. The conductive particles in binder provide conductive pathways between the conductive layers of TCO or semitransparent conductive oxide, thus forming a multi-layer electrode.

Alternatively, a multilayer structure having at least one nanostructure-film can be used as transparent conductor, as described for examples in U.S. Pat. No. 8,390,589, U.S. Pat. No. 8,094,247, and U.S. Pat. No. 8,018,563. Nanostructure-films include but are not limited to nanotubes, nanowires, nanoparticles, and graphene flakes, typically dispersed in an optically clear matrix material.

A plurality of metal traces are in electrical communication with the transparent conductive layer. Exemplary metals include for example and without limitation, tin, silver, gold, copper, aluminum, zinc, nickel, and chrome. The metal traces typically have a thickness of at least 2 or 3 microns ranging up to 5, 10, 11, 12, 13, 14, 15, or 20 microns. The width of the metal traces is typically at least 10, 25, 30, 35, or 40 microns and typically no greater than 75, 70 or 60 microns. However, metal traces having different thickness and widths can also be utilized.

In some embodiments, both the transparent conductive layer and metal traces are patterned using photolithography and etching methods as shown in the prior art (See for example WO2013/049267 and WO2013/3010067). Other methods of forming metal traces are known in the art.

Suitable optically transparent adhesive material include, for example, a curable adhesive composition containing a) a first oligomer comprising (meth)acrylate ester monomer units, hydroxyl-functional monomer units, and monomer units having polymerizable groups; b) a second component comprising $C_2$-$C_4$ alkylene oxide repeat units and polymerizable terminal groups, and c) a diluent monomer component. The polymerizable groups of the first oligomer are typically free-radically photopolymerizable groups, such as pendent (meth)acrylate groups or terminal aryl ketone photoinitiator groups. Such curable adhesive compositions are described in PCT Publication No. WO2014/093014, which is incorporated herein by reference as if fully set forth. Additional suitable optically transparent adhesive materials include acrylic adhesives, for instance acrylic adhesives commercially available from 3M Company (St. Paul, Minn.), such as 3M 8142-KCL. Another suitable optically transparent adhesive material includes polycarbonate resin with a transmission factor of not less than 90%. Other typical suitable optically transparent adhesive materials are known to those of skill in the art. In certain embodiments, a storage modulus of the optically transparent adhesive layer is not greater than about $1.75 \times 10^5$.

Optically transparent adhesives are also utilized to form a touch sensor, such as depicted in FIG. 4.

The cured organic polymeric layer (150, 152, 250, 252, 350) comprises a different material than the flexible transparent substrate. The cured organic polymeric layer typically comprises a thickness of at least 5 microns and typically no greater than 50, 45, 40, 35, 30, or 25 microns. In some embodiments, the thickness is no greater than 20, 15, or 10 microns. Thus, in some embodiments, the cured organic polymeric layer can be substantially thinner than a coverlay of flexible transparent substrate and optically transparent adhesive.

In some embodiments, the cured organic polymeric layer has a tensile strength at break after curing of at least 1, 5, 10, 15 or 20 MPa and typically no greater than 150, 125, 100, 75, 70, or 60 MPa. The tensile modulus of cured organic polymeric layer (e.g. dry film solder mask) can be at least 0.5 or 1 GPa ranging up to 2, 3, 4, or 5 GPa. The tensile properties are related to the flexibility of the cured organic polymeric layer. In contrast, the flexible transparent substrate (e.g. 125 microns "MELINEX ST 505" or "MELINEX ST 505") has a tensile strength of 180-230 MPa.

By inclusion of the cured organic polymer layer, the metal traces of the interconnect circuit tab can be bent to a radius of 2 mm at least 40 cycles as further described in the examples.

In some embodiments, the cured organic polymeric layer (150, 250, 350) comprises a material commonly known as a "dry film solder mask". Dry film solder masks generally comprises a partially polymerized or partially cured organic polymer comprising materials such as (meth)acrylate, epoxy, urethane, polyimide, and combinations thereof.

One example of a poly(meth)acrylate dry film solder mask is described in US2006/0178448. Poly(methyl methacrylate) (PMMA) is generally a polymer of methyl methacrylate, a monomer having a glass transition temperature (Tg) greater than room temperature (25° C.). Dry film solder masks typically include at least one additional monomer having a Tg less than room temperature (25° C.) or less than 0° C. and/or at least one trifunctional crosslinking monomer. Represented monomers include for example 1,4-butanediol di(meth)acrylate, 1,6-hexanediol di(meth)acrylate, neopentylglycol di(meth)acrylate, polyethylene glycol di(meth)acrylate, neopentylglycol adipate di(meth)acrylate, neopentylglycol di(meth)acrylate hydroxypivalate, dicyclopentadienyl di(meth)acrylate, caprolactone modified dicyclopentadienyl di(meth)acrylate, allylated cyclohexyl di(meth)acrylate, isocyanurate di(meth)acrylate, trimethylol propane tri(meth)acrylate, dipentaerythriol tri(meth)acrylate, pentaerythriol tri(meth)acrylate, methyl trimethyl tri (meth)acrylate, tris(acryloxyethyl)isocyanurate), dipentaerythriol penta(meth)acrylate, and dipentaerythriol hexa (meth)acrylate.

Various dry film solder masks are commercially available such as from Hitachi Chemical as the trade designation "PHOTOSENSITIVE COVERLAY FILM RAYTECH FR5438"; Arisawa Manufacturing Co., Ltd as the trade designation "Photosensitive CVL "RTA S14"; DuPont as "PYRALU™ PC100"; Teamchem Material Company as the trade designation "PY20".

Polymerizable resins can also be utilized for the cured organic polymeric layer. Such material are generally liquids at room temperature (25° C.) comprises unpolymerized or partially polymerized organic polymer comprising materials such as poly(meth)acrylate, epoxy, urethane, polyimide, and combinations thereof.

In some embodiments, such materials further comprise inorganic fillers such as silica, alumina, talc. and thus are typically not optically transparent. Polymerizable liquid resins that are not optically transparent are suitable for the interconnect circuit and the bezel region, but not the central region (e.g. viewing area). Suitable material include polymerizable inks such as available from Asahi chemical Co., Ltd as the trade designation "ASAHI SUPER RESIST CCR-232"; from Taiyo Ink, Mfg. Co., (Korea) Ltd as the trade designation "TF-200 FR2" and from Hitachi Chemical as "SN-9000". These materials can be applied by screen printing and other printing processes used for ink and are generally cured at 150° C. Another suitable material is a polyimide based resin SN-9000NHA and hardener SN-9000NHB from Hitachi chemical that are mixed in 20:1 wt. percent ratios.

The curable organic polymer can be cured by various techniques including radiation curing (e.g. electron beam, ultraviolet curing), thermally cured, or a combination thereof. In some embodiments, regions of curable organic polymer are cured whereas other regions remain uncured on the surface can be dissolved away in a development step. In this embodiment, the cured organic polymeric material may be present only in the desired regions, such as only in the region of the interconnect circuit tab.

In another embodiment, a method of making a transparent conductive substrate is described comprising providing a flexible transparent substrate comprising a transparent conductive layer disposed on the flexible transparent substrate and a plurality of metal traces disposed on the flexible transparent substrate such that the metal traces are in electrical communication with the transparent conductive layer and a portion of the flexible transparent substrate comprising the metal traces forms an interconnect circuit tab; and applying a layer of an organic polymerizable material to the metal traces and flexible transparent substrate of at least the interconnect circuit tab; and curing the organic polymerizable material.

The general fabrication of providing the flexible transparent substrate with the requisite conductive layers is known in the art. The method may generally comprise pattern coating a flexible transparent substrate (e.g. PET) with transparent conductive layer (e.g. ITO) and metal traces using photolithography. The interconnect circuit and the optionally the bezel region are masked with a dry film solder mask or liquid polymerizable resin to selectively etch metal from the viewing area. In some embodiments, masked region is retained to provide the exposed surface layer of cured organic polymeric material. The dry film solder mask and liquid polymerizable resin can be cured by photocuring, thermal curing, or a combination thereof.

EXAMPLES

Materials

TABLE 1

| Material descriptions | |
|---|---|
| Abbreviation or Trade Name | Description |
| ITO | Indium Tin Oxide conductive layer |
| DFSM | Dry Film Solder Mask (i.e. Raytec FR-5425 from Hitachi Chemical Co., Ltd, Japan). This is a photosensitive resist sheet applied by vacuum lamination. |
| APD | AgPdNd metallic alloy as detailed within WO2014/168712 |
| PET | Poly Ethylene Terephthalate (e.g. 125 mu thick Melinex ST 506 from DuPont Teijin films, Chester, VA, USA) |
| OCA | Optically Clear Adhesive |
| HumiSeal 1B73 | One part Acrylate based conformal electronics coating material from Chase Corporation, Bridgewater, MA, USA |

Touch Sensor Process

Table 2 provides a general overview of 4 different fabrication sequence processes detailed in 10 process steps. The first two of these processes utilize copper as the metallic layer over initial ITO layer and the last two utilize APD (see process step 2). Processes A) and C) use Dry Film Solder Mask as the interconnect circuit tab and bezel surface layer material and processes B) and D) use photopolymerizable resin as the interconnect circuit and bezel surface layer material. Two different metal process steps and two bezel and circuit tab materials result in the 4 processes (A-D) selected for illustration of optional processing conditions for fabrication of the touch screen. Processes A-D are described in detail in the following paragraphs.

Table 2A and 2B show some process steps which are common to all 4 processes including steps 1, 3, 4, 6, 7, 8, 9 and 10. Table 2 also shows some process steps which are unique to one subset of processes and will be described as process steps 2a and 2b (as alternatives to Metal coating step) and steps 5a and 5b (as alternatives to bezel masking step). The following paragraphs provide details for each of these numbered process steps followed by the paragraphs that describe the 4 processes A-D in particular.

Table 2A and 2B: Overview Comparison of 4 Illustrative Processes

TABLE 2A

| | Process Steps | | | | |
|---|---|---|---|---|---|
| Fabrication Process | 1. Composite ITO Coating on PET | 2. Metal coating on ITO (both sides) | 3. Photolithographic patterning (ITO and metal - both sides) | 4. Strip residual photoresist | 5. Mask Bezel area |
| A) Dry film solder mask with Copper | Yes | 2a) Copper | Yes | Yes | 5a) Dry Film Solder Mask |
| B) Liquid | Yes | 2a) Copper | Yes | Yes | 5b) Photo- |

TABLE 2A-continued

| | Process Steps | | | | |
|---|---|---|---|---|---|
| Fabrication Process | 1. Composite ITO Coating on PET | 2. Metal coating on ITO (both sides) | 3. Photolithographic patterning (ITO and metal - both sides) | 4. Strip residual photoresist | 5. Mask Bezel area |
| polymerizable resin with Copper | | | | | polymer Resin |
| C) Dry film Solder Mask with APD metal alloy | Yes | 2b) APD | Yes | Yes | 5a) Dry Film Solder Mask |
| D) Liquid Polymerizable Resin with APD metal alloy | Yes | 2b) APD | Yes | Yes | 5b) Photo-polymer Resin |

TABLE 2B

| | Process Steps | | | | |
|---|---|---|---|---|---|
| Fabrication Process | 6. Mask connection area. | 7. Selective etch metal from viewing area | 8. (Optional) Tab perforation or slitting | 9. Cover plating | 10. Touch sensor construction |
| A) Dry film solder mask with Copper | Yes | Yes | Yes | Yes | Yes |
| B) Liquid polymerizable resin with Copper | Yes | Yes | Yes | Yes | Yes |
| C) Dry film Solder Mask with APD metal alloy | Yes | Yes | Yes | No | Yes |
| D) Liquid Polymerizable Resin with APD metal alloy | Yes | Yes | Yes | No | Yes |

Step 1) Composite ITO Coating on PET

The PET film used for each of these processes was commercially available as 125 micron thick Melinex ST 506 poly ethylene terephthalate from DuPont Teijin films, Chester, Va., USA. The step labelled "Composite ITO coating on PET" involves vacuum deposition (also known as sputtering) of multi-layer transparent electrode structure of ITO/SiAlOx/ITO layers on both major surfaces of PET film. The process for deposition of this multi-layer electrode structure is detailed in prior art US2011/0139516. The resultant multi-layer ITO coating was measured for sheet resistance using conventional 4 point probe measurement on Loresta-AX MCP-T370 from Mitsubishi with resulting measurement value of 120 Ohms/sq. The measured optical transmittance value is normally >90% as measured in the visable range using Haze-gard from BYK-Gardner USA.

Step 2a) Copper Coating on ITO

This step results in a metallic Cu coating on both major surfaces that were previous coated with ITO coating step 1). For the Copper metal coating processes, the coating involves the steps (i) conventional vacuum deposition of Copper to a thickness of approximately 500 nm followed by (ii) second step of conventional electroplating to get final thickness of approximately 12 um thick copper.

Step 2b) APD Coating on ITO

This step results in a metallic AgPdNd alloy coating (labelled as APD) on both major surfaces that were previous coated with ITO coating step 1). For the APD metal coating processes, the coating involved a vacuum deposition process as describe in WO2014/168712 with final thickness of 500 nm.

Step 3) Photolithographic Patterning (ITO and Metal Coating Both Sides)

Transparent conductive electrodes and metal traces (either Cu or APD) are patterned using photolithography and etching methods as shown in the prior art (i.e. WO2013/049267, WO2013/3010067). Dry film photoresist based on polymethacrylates such as Kolon Dry film KM-1150 from Kolon industries Inc. Republic Korea was laminated on the substrate using conventional equipment. Lamination is performed with a temperature of 100-120 C and at a pressure of 33 PSI. A phototool is fabricated consisting of clear and dark portions of desired pattern and placed on the substrate. A subsequent UV light exposure of 50-60 mJ/cm2 energy is used to expose and polymerize the photoresist through clear areas of the phototool. During subsequent development in an aqueous sodium carbonate solution of 0.8 wt % at 30 C, the non-polymerized portions of photoresist dissolve away to provide access to underlaying metal layers.

The resulting photoresist pattern is then rinsed with water and air dried prior to etching process. In the etching process, both ITO and metal (either Cu or APD) layers are simultaneously etched using redox etching solution. Typical example of such redox etchant consists of aqueous solutions of Cupric chloride (180 g/l) from Mercury Chemicals Pte Ltd, Singapore, and 1-2 Molar Hydrochloric acid from Mercury Chemicals Pte Ltd, Singapore. Etching was carried out at 45-60 C by spraying the etchant with 30-45 PSI pressure on the substrate material using conventional etching equipment. Thus, this etching step removes both the ITO and metal (either Cu or APD) layer in the areas where the photoresist layer was not present.

Step 4) Strip Residual Photoresist

After completion of photolithographic patterning of step 3) is completed, the residual photoresist is no longer necessary. For each of the processes, the residual photoresist layer is stripped using a stripping solution including 25 wt % monoethanolamine (MEA), available from Aik Moh Paints & Chemicals Pte Ltd, Singapore, in water at a temperature of about 45° C. using a roll-to-roll stripper machine. The stripper solution was sprayed in a roll-to-roll process through a nozzle at a spray pressure of about 20 psi. Then, the etched layered structure is rinsed with water by spraying it onto the substrate, and air dried.

Step 5a) Mask Bezel Using with Dry Film Solder Mask

This step involves the application of a dry film solder mask as a permanent photoresist coverlay to mask the both the bezel region and the interconnect circuit tab region. This results in a cured organic polymer material which prevent the metallic layer (copper or APD) in the bezel or interconnect circuit tab areas (FIG. 1) from being etched in later etching step. This dry film solder mask coverlay, using Raytec FR-5425 from Hitachi Chemical Co., Ltd, Japan, is applied in a conventional vacuum laminator from Sidrabe Inc with lamination temperature set to 110° C.

The substrate from process step 4) with patterned metallic layer and ITO layer was laminated to partially cured dry film by means of selective light exposure to metal bezel area while blocking exposure to touch sensor area and bonding pad area. To perform this selective light exposure, a Mylar phototool is used in conjunction with uniform UV light exposure energy of 70 mJ/cm2 from a high pressure mercury lamp. The Mylar phototool allows exposure to the metal bezel area while blocking light from the touch sensor view area and bonding pad area. FR5425 dry film polymerized in light exposed area and the remaining portions are not polymerized so that they will dissolve in an aqueous 0.8% sodium carbonate solution at 30 C during development step. After developing step, the FR-5425 film is further cured by exposing to UV light with 1 J/cm2 energy followed by heating at 140 C.

Step 5b) Mask Bezel Using Liquid Polymerizable Resin

This step involves application and curing of a liquid polymerizable resin (using i.e. screen printing) to form a cured organic polymeric layer in the bezel region including the interconnect circuit tab. This layer masks both the bezel area and the interconnect circuit tab so as to prevent the metal coating (either Cu or APD) from being etched in later process steps. In this process, resin can be applied on the metal bezel and interconnect circuit tab areas via screen printing or other suitable method. One suitable material is polyimide based resin SN-9000NHA and hardener SN-9000NHB from Hitachi chemical are mixed in 20:1 wt percent ratios. SN-9000 is a polyimide based resin which is suitable for screen printing processes. Resin mixture can be selectively applied on bezel area while avoiding the bonding pad region by technique such as screen printing or spraying through mask. For the screen printing method, polyester screen mesh of wire diameter 44 um and aperture 157 um can be placed on the touch sensor substrate and SN9000 resin mixture can be spread over the mesh and printed using 22N/cm screen tension. The printed substrate can then cured by heating at 140 C/60 min in an oven.

Step 6) Mask Connection Area

This step involves the application of tape over the connection area of the interconnect circuit tab to mask the copper in that area as a temporary process aid. 3M Kapton adhesive tape 5413 was manually pasted on the bonding pad area to act as reworkable protective layer. It prevents any etching of the bonding pads during following process step 7) for etching metal from the viewing area. Temporary tape will be removed before cover plating process and assembly processes.

Step 7) Selective Etch Metal from Viewing Area

This process step removes the metallic layer (Cu or APD) from in the view area by selectively etching from the underlying ITO layer. Metal selective etchant consist of cupric chloride 1.5 moles/liter, ammonium chloride 6 moles/liter. pH value of the etching solution was adjusted to 8.5 pH by adding ammonium hydroxide. Temperature of etching solution was kept at 50-50 C. Etching of metal layer (either Cu or APD) is carried out by spraying etching solutions to the substrate with 30 PSI pressure. Substrate is then washed by dilute ammonium hydroxide solution. During this etching step the cured organic polymeric layer (DFSM of step 5a or conforming polymerizable resin of step 5b) protects the metal (Cu or APD) in the bezel and interconnect circuit tab areas from being etched. Finally, substrate is rinsed by water and then air dried.

Step 8) (Optional) Tab Perforation or Slitting

This step involves an optional laser cut to form individual segments with connector tab, and can also (optionally) be used to perforate the tab to make it more flexible and better enable connection of the traces to the controller board (FIGS. 2a and 2b). The pressure sensitive double sided adhesive 3M 467MP from 3M is pasted on the transparent substrate, opposing side of bonding pad. A 2 mil thick stiffener, DuPont Kapton FPC polyimide film from DuPont, is pasted on the top of adhesive film. In accordance with the desired touch sensor module size, touch sensor substrate is cut out by laser cut process using laser machine from Preco Inc. The resulting touch sensor substrate consists of touch view area with transparent substrate and transparent conductive electrodes and non view area with metal bezel. In touch non-view area metal traces are terminated with bonding pads in tab portions of same transparent substrate. Tab length is ranging from 2 cm-20 cm from the periphery of touch sensor substrate. Tab portions are perforated to facilitate easy bending of the tab while inserting bonding pad to ZIF connectors of electronic units of touch sensor. Perforation are made by laser cut process using laser machine from Preco Inc. Diameter of the perforated circle ranges from 25-75 um.

Step 9) Cover Plating (Preferred for Cu Examples)

Kapton reworkable tape (3M 5413) on bonding pad area is removed by peeling it off from the surface. Exposed copper metal in the bonding pad area are then coverplated with non-corrosive metal such as Gold, Tin, Silver, Nickel. Tin plating was carried out by the Stannatech process from Autotech Inc. In stannatech process, substrate is cleaned by acid cleaner consists of dilute sulphuric acid and micro etch consist of sodium persulphate and 30 wt % sulphuric acid. Plating is carried out by dipping the bonding pad area into Stannadip solution from Autotech Inc at 50-60 C for 2 minutes followed by stannatech from Autotech Inc at 50-60 C for 5 minutes. Tin plated sample is then rinsed with water followed by air drying.

Step 10) Touch Sensor Construction

Touch sensor construction is shown schematically in FIG. 4. Touch sensor substrate with row and column transparent electrodes is laminated using optically clear adhesive (i.e. 50 um OCA 3M 8146 from 3M) to form a matrix type electrodes for capacitive touch sensor applications. Bonding pad from tab portion of touch sensor substrate are directly inserted Zero Insertion Force (ZIF) connectors of electronic units of touch sensor module.

Process A) Dry Film Solder Mask with Copper

As previously described in Table 2, Process A) includes process steps 1, 2a, 3, 4, 5a, 6, 7, 8, 9 and 10 as detailed in above paragraphs.

Process B) Liquid Polymerizable Resin with Copper

As described in Table 2, Process B) includes process steps 1, 2a, 3, 4, 5b, 6, 7, 8, 9, and 10 as detailed in above paragraphs.

Process C) Dry Film Solder Mask with APD Metal Alloy

As described in Table 2, Process C) includes process steps 1, 2b, 3, 4, 5a, 6, 7, 8, 9, and 10 as detailed in above paragraphs.

Process D) Liquid Polymerizable Resin with APD Metal Alloy

As described in Table 2, Process D) includes process steps 1, 2b, 3, 4, 5b, 6, 7, 8, 9, and 10 as detailed in above paragraphs.

Bending Failure Test:

A bending failure test was conducted using an Elecometer 1501 cylindrical mandrel bend tester with 2 mm diameter bar. The interconnect circuit samples were folded around the mandrel and bent over on both front and reverse sides. The resistance values for the sample circuits were measured using two probe Fluke multimeter across terminal of the transparent conductive electrode and the bonding pads. The samples were bent repeatedly until failure was indicated by increased resistance.

Sample Results:

TABLE 3 sample test results from bending failure.

| Sample | | Number of bending cycles until failure |
|---|---|---|
| Comparitive Example 1: | 1 mm width × 50 nm thick ITO lead | 1 |
| Comparative Example 2: | 5 mm width × 3 micron thick Cu lead | 10 |
| Comparative Example 3: | 40 micron width × 12 micron thick Cu lead | 30 |
| Example 1: | 40 micron width × 12 micron thick Cu lead with 25 micron DFSM (Process A) | 100 |
| Example 2: | 40 micron width × 12 micron thick Cu lead with 50 microns thick SN-9000 coating (Process B) | >100 |

The invention claimed is:

1. A transparent conductive component comprising:
a flexible transparent substrate;
a transparent conductive layer disposed on the flexible transparent substrate at least at a central region of the flexible transparent substrate;
a plurality of metal traces disposed on and in electrical communication with the transparent conductive layer wherein a portion of the flexible transparent substrate, metal traces and optionally the transparent conductive layer forms an interconnect circuit tab;
wherein at least the interconnect circuit tab comprises an exposed surface layer of cured organic polymeric material.

2. The transparent conductive component of claim 1 wherein at least the interconnect circuit tab is free of PET coverlay.

3. The transparent conductive component of claim 1 wherein the cured organic polymeric material is disposed at a bezel region adjacent the interconnect circuit tab of the transparent conductive component.

4. The transparent conductive component of claim 3 wherein the bezel region is free of PET coverlay.

5. The transparent conductive component of claim 1 wherein a cover layer is disposed upon a central region of the transparent conductive layer except for the interconnect tab.

6. The transparent conductive component of claim 5 wherein the cover layer is glass, a polymeric coverlay, or a cured organic polymeric material.

7. The transparent conductive component of claim 1 wherein the cured organic polymeric material has a thickness ranging from 5 to 50 microns.

8. The transparent conductive component of claim 1 wherein the cured organic polymeric material has a thickness ranging from 5 to 10 microns.

9. The transparent conductive component of claim 1 wherein the transparent conductive layer has a thickness less than 100 or 75 nanometers.

10. The transparent conductive component of claim 1 wherein the cured organic polymeric material has a tensile modulus ranging from 1 to 5 GPa.

11. The transparent conductive component of claim 1 wherein the cured organic polymeric material comprises a cured (meth)acrylate or cured epoxy polymerizable resin.

12. The transparent conductive component of claim 1 wherein the flexible transparent substrate has a thickness ranging from about 50 to 200 microns.

13. The transparent conductive component of claim 1 wherein the transparent conductive layer comprises indium tin oxide.

14. The transparent conductive component of claim 1 wherein the metal traces have a thickness ranging from about 3 to 15 microns and a width ranging from about 25 to 60 microns.

15. The transparent conductive component of claim 1 wherein the flexible transparent substrate of the interconnect circuit tab further comprises perforation.

16. The transparent conductive component of claim 1 wherein the metal traces form bonding pad near a peripheral edge of the interconnect circuit tab and a stiffening layer is disposed on the opposing surface of the flexible transparent substrate as the bonding pads.

17. The transparent conductive component of claim 16 wherein a bezel region lacks the cured organic material and comprises a corrosion resistant metal material at the exposed surface layer.

18. The transparent conductive component of claim 1 wherein the metal traces do not crack when the interconnect circuit tab is bent to a radius of 2 mm at least 40 cycles.

19. A touch sensor comprising the transparent conductive component of claim 1.

20. A method of making a transparent conductive component comprising:
providing a flexible transparent substrate comprising a transparent conductive layer disposed on the flexible transparent substrate and a plurality of metal traces disposed on the flexible transparent substrate such that the metal traces are in electrical communication with the transparent conductive layer and a portion of the flexible transparent substrate comprising the metal traces forms an interconnect circuit tab;

applying a layer of an organic polymerizable material to the metal traces and flexible transparent substrate of at least the interconnect circuit tab;

curing the organic polymerizable material.

21. The method of claim 20 wherein the organic polymerizable material comprises a dry film solder mask.

22. The method of claim 20 wherein the organic polymerizable material comprises a liquid polymerizable resin.

23. The method of claim 20 wherein the curing comprises photocuring, thermal curing, or a combination thereof.

* * * * *